(12) United States Patent
Takada

(10) Patent No.: US 7,864,578 B2
(45) Date of Patent: Jan. 4, 2011

(54) SEMICONDUCTOR MEMORY REPAIRING A DEFECTIVE BIT AND SEMICONDUCTOR MEMORY SYSTEM

(75) Inventor: Tomoji Takada, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 12/164,782

(22) Filed: Jun. 30, 2008

(65) Prior Publication Data
US 2009/0323417 A1    Dec. 31, 2009

(51) Int. Cl.
G11C 16/04    (2006.01)
G11C 7/00     (2006.01)
G11C 29/00    (2006.01)

(52) U.S. Cl. ................ 365/185.09; 365/185.11; 365/200; 365/201

(58) Field of Classification Search ............ None
See application file for complete search history.

(56) References Cited

U.S. PATENT DOCUMENTS 7,242,615 B2 *   7/2007   Nagashima ............ 365/185.09

2007/0245098 A1   10/2007  Takada
2008/0177956 A1 *  7/2008  Peddle .................. 711/156

FOREIGN PATENT DOCUMENTS

JP    2002-140899    5/2002

* cited by examiner

Primary Examiner—Hoai V Ho
Assistant Examiner—James G Norman
(74) Attorney, Agent, or Firm—Oblon, Spivak, McClelland, Maier & Neustadt, L.L.P.

(57) ABSTRACT

A semiconductor memory has a plurality of blocks, and each of the blocks comprises a plurality of pages, and further, each of the pages has a plurality of memory cells. A block having defective bits less than N (N is an integer number more than 0) in all pages of the block stores a first data showing a normal block. A block including at least one page having defective bits more than N and including no page having defective bits more than M (M is an integer number of M>N) stores a second data showing a psedo-pass block as a pseudo-normal block. A block including at least one page having defective bits more than M stores a third data showing a defective block.

17 Claims, 8 Drawing Sheets

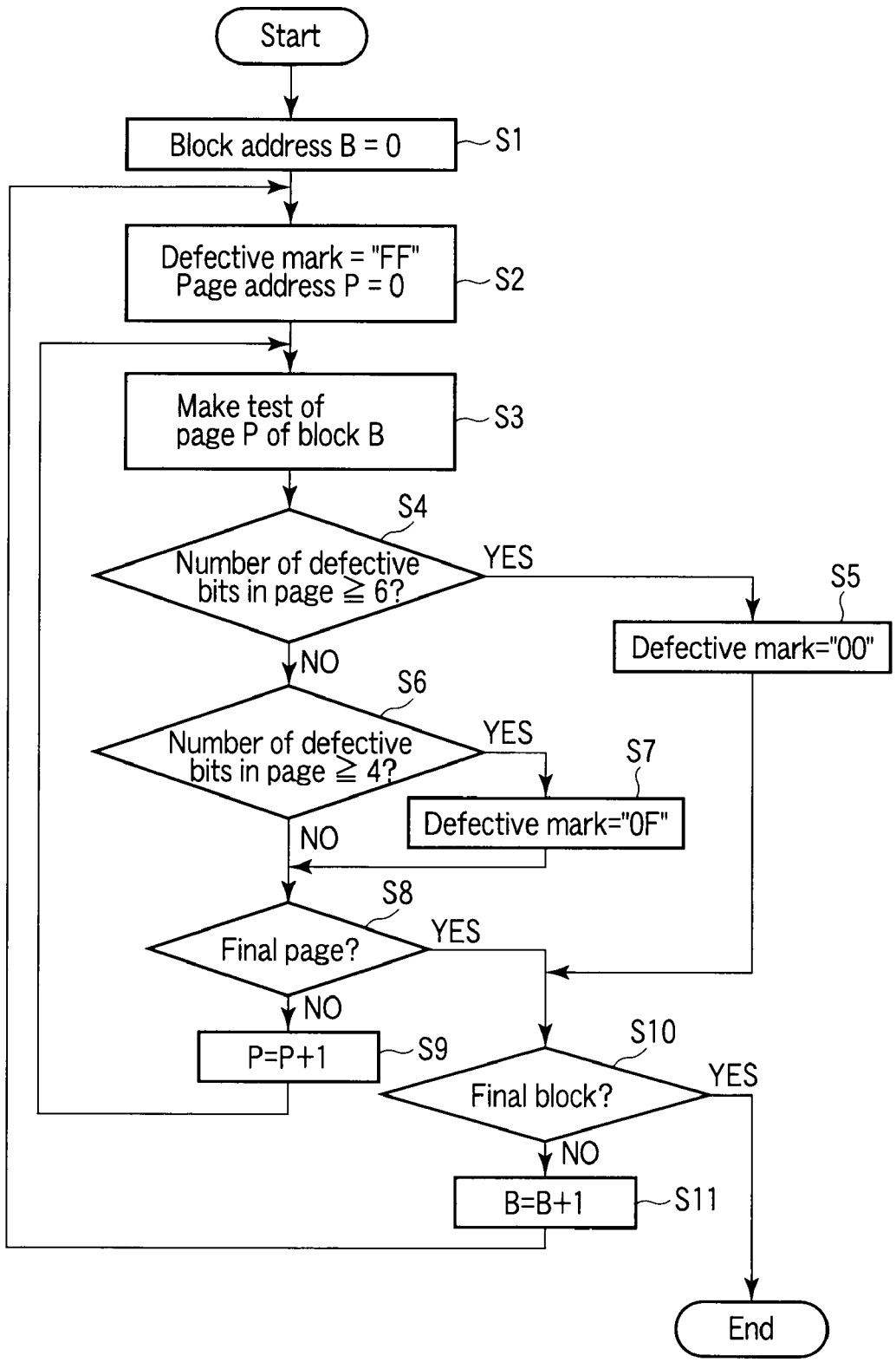
F I G. 1

| Number of defective bits | Generation ratio of defective bits | Accumulated generation ratio | Number of pages | Number of Accumulated pages | Category of block |
|---|---|---|---|---|---|
| 0 | 0.43046721 | 0.43046721 | 225689 | 225689 | Pass |
| 1 | 0.38263752 | 0.81310473 | 200612 | 426301 | Pseudo-pass 1 |
| 2 | 0.14880348 | 0.96190821 | 78016 | 504317 | Pseudo-pass 2 |
| 3 | 0.03306744 | 0.99497565 | 17337 | 521654 | Pseudo-pass 3 |
| 4 | 0.00459270 | 0.99956835 | 2408 | 524062 | Pseudo-pass 4 |
| 5 | 0.00040824 | 0.99997659 | 214 | 524276 | Pseudo-pass B |
| 6 | 0.00002268 | 0.99999927 | 12 | 524288 | Pseudo-pass B |
| 7 | 0.00000072 | 0.99999999 | 0 | 524288 | Defective 7 |
| 8 | 0.00000001 | 1.00000000 | 0 | 524288 | Defective 8 |

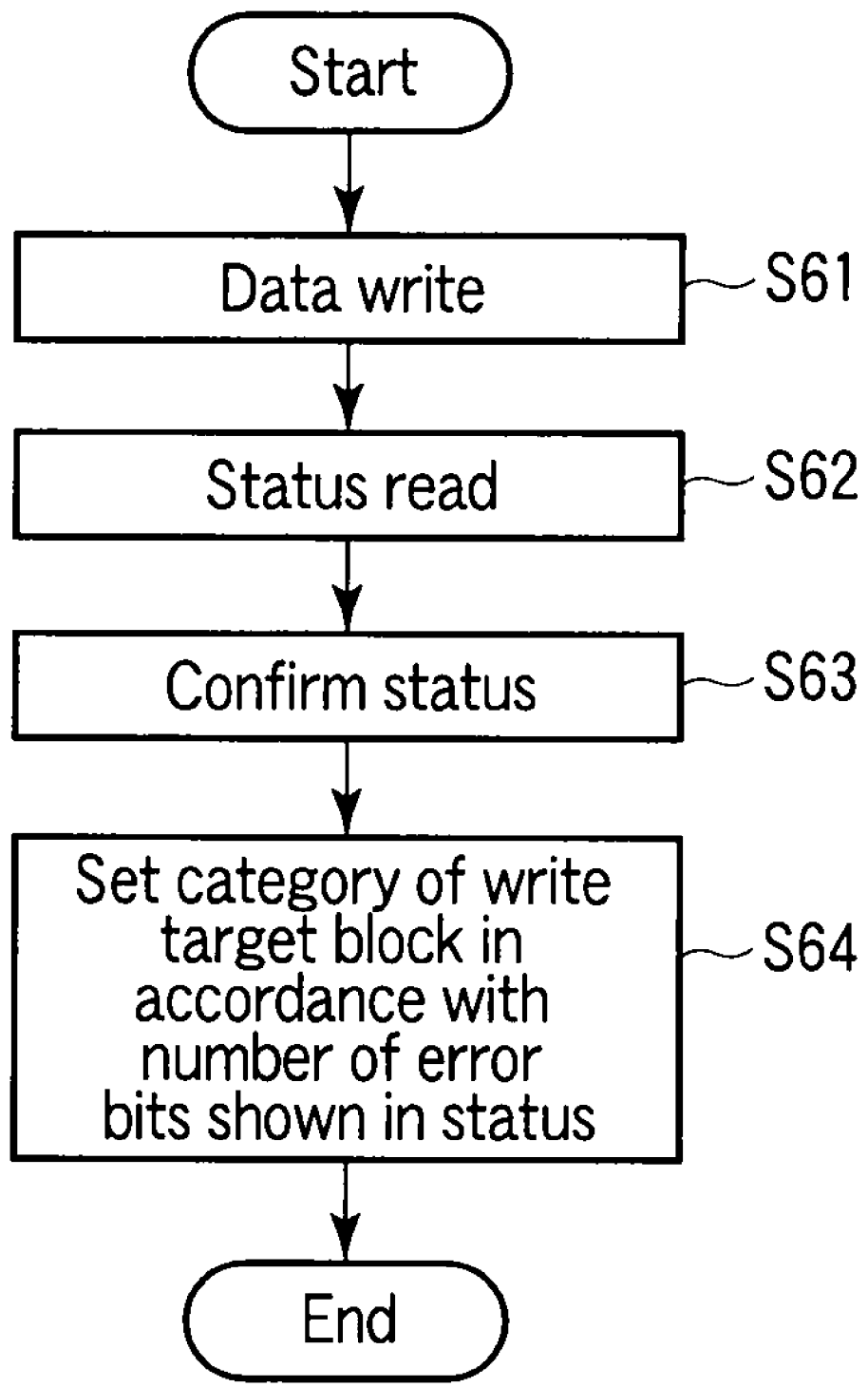
F I G. 11

SEMICONDUCTOR MEMORY REPAIRING A DEFECTIVE BIT AND SEMICONDUCTOR MEMORY SYSTEM

BACKGROUND OF THE INVENTION

1. Field of the Invention

The present invention relates to a non-volatile memory such as a NAND flash memory. In particular, the present invention relates to a semiconductor memory, which can repair a defective bit before and after shipment, and to a semiconductor memory system.

2. Description of the Related Art

Recently, a bit capacity of a non-volatile memory rapidly increases with advance in a semiconductor refinement technique. For this reason, according to a memory chip screening test, a large number of defective products (memory chips) are generated. This is because the screening test is made on the premise that all bits of a memory are non-defective in manufacturing. As a result, it is difficult to secure sufficient yield. Therefore, the following various defective bit redundancy techniques are practically employed so that a memory chip having minor defective bits is used as a non-defective chip.

(1) Redundancy Technique of Repairing Defective Bits in a Memory Chip

The following techniques are given as the redundancy technique. One is a column redundancy technique of replacing a defective column with a non-defective column. Another is a block redundancy technique of replacing a defective block with a non-defective block. Hereinafter, simultaneously erasable areas call an erase block, and the erase block unit is referred to simply as block. One block includes a plurality of pages as a write/read unit. Each page comprises a plurality of memory cells.

(2) Defective Bit Redundancy Technique Executed by a Controller Built in a Non-Volatile Memory The following techniques are given as the defective bit redundancy technique. One is an error correction technique using an Error Check and Correction (ECC) circuit. Another is a defective column skip technique of skipping a defective column, and replacing the defective column with a normal column. Another is a defective block replacement technique of replacing a defective block with a normal block.

(3) Memory Chip Test Technique

A pseudo-pass technique is given as the test technique (For example, see Jpn. Pat. Appln. KOKAI Publication No. 2002-140899). According to the pseudo-pass technique, correction by the ECC circuit is set force as a premise, and even if minor defective bits exist in a page, this is disregarded so that the page is passed as a pseudo-normal page.

Of the techniques, the ECC technique is specifically effective as the defective bit redundancy technique, and has the following features. According to the features, if an increase of a circuit scale is allowed, a design of an ECC circuit is flexibly made in accordance with intensity of required error correction.

According to the pseudo-pass technique, defective bit correction by the ECC technique is set force as a premise. In this way, the yield of memory is largely improved. A correction unit by the ECC circuit (referred to as ECC unit) is 512 bytes, for example. A 4-bit/512 byte ECC technique is set force as a premise. The 4-bit/512 byte ECC technique can correct four defective bits or less of the ECC unit. Based on the ECC technique, a two-bit pseudo-pass technique is practically used. According to the two-bit pseudo-pass technique, even if two defective bits exist per one page (2 Kbytes=2048 bytes), the page is passed as a normal page.

Recently, a non-volatile memory built in a memory card has the following tendency. According to the tendency, the number of writable/readable bits in one time=page size rapidly becomes large to meet the requirements of high speed. Conventionally, a 130-nm-generation NAND flash memory has 512 bytes per page (small block). However, a 90-nm-generation NAND flash memory has 2 Kbytes per page (large block). In future, there is a likelihood of the NAND flash memory having 4 or 8 Kbytes per page. For this reason, the ECC circuit has a tendency for the number of bits corrected in one time to increase. However, the ECC circuit has a problem that as the ECC unit becomes larger, the circuit scale rapidly increases. Thus, in a 70-nm NAND flash memory, one page (2 Kbytes) is divided into four 512-byte portions, and then, correction by the ECC circuit is made four times. Further, there is a tendency for a gap between the page size and the ECC unit to become large more and more.

For example, the number of defective portions (defective bits) correctable by the ECC circuit is set as X, and defective portions disregarded by the pseudo-pass technique is set as Y, and further, one page is divided into Z ECC units to make corrections. In this case, even if M defective portions concentrates on one ECC unit, the correction ability by the ECC circuit is limited; therefore, the following equation (1) is established.

$$X \geq M \quad (1)$$

Here, a relation of $\alpha = X - M$ is set. In this case, $\alpha$ is the number of later allowable defective bits. Specifically, $\alpha$ is the allowable number of defective bits generated later after a screening test is made before shipment of a non-volatile memory, and is margin of the number of defective bits. When $\alpha = 0$, if one defective bit is generated later, this exceeds correction ability by the ECC circuit; as a result, a memory system falls in a dangerous state. For this reason, $\alpha = 0$ is not set considering the use of the memory system, data retention intensity, for example, degradation of a memory cell by repeatedly making write and erase with respect to the memory cell. Therefore, as seen from the following equation (2), defective portions Y disregarded according to the pseudo-pass technique is set under the condition that the number $\alpha$ of allowable defective bits generated later is 1 or more.

$$Y = X - \alpha, \ \alpha \geq 1 \quad (2)$$

In the 70-nm multi-level NAND flash memory, the following parameters are practically used. Specifically, Z=4 (page size: 2 KB/ECC unit: 512 bytes, Y=2 (2-bit pseudo-pass), X=4 (4 bits/512 bytes redundancy), and $\alpha = 2$.

As described above, there is a tendency for page size and ECC unit to become large more and more in future. The difference between the page size and the ECC unit becomes large, and thereby, the following problem arises. Specifically, the upper limit of the number of allowable defective bits according to the pseudo-pass technique is defined by the equation (2). However, as the difference between the page size and the ECC unit becomes large, namely, as the ECC unit number Z become large, the following probability that M defective bits all concentrate on one ECC unit in one page rapidly becomes small. In other words, the upper limit of the equation (2) is the upper limit of M portions that correction by the ECC circuit is secured in the worst case having a very low generation probability. In fact, in most of cases, M defective portions properly disperse in Z ECC units. For this reason, even if M portions exceeding the equation (2) exist, correction is sufficiently made by the ECC circuit correcting X portions. Therefore, according to the conventional pseudo-pass technique, a non-volatile memory chip, which is still sufficiently usable as a non-defective product, is determined as a defective product. Thus, it is desired to provide a semiconductor memory and a semiconductor memory system, which can further improve the yield.

BRIEF SUMMARY OF THE INVENTION

According to a first aspect of the invention, there is provided a semiconductor memory comprising: a plurality of blocks, each of the blocks comprising a plurality of pages, each of the pages having a plurality of memory cells; and a mark storage area provided at each of the blocks, the mark storage area of a block having defective bits less than N (N is an integer number more than 0) in all page in the blocks storing a first data showing a normal block, the mark storage area of a block including at least one page having defective bits more than N and including no page having defective bits more than M (M is an integer number M>N) storing a second data showing a pseudo-pass block as a pseudo-normal block, and the mark storage area of a block including at least one page having defective bits more than M storing a third data as a defective block.

According to a second aspect of the invention, there is provided a semiconductor memory system comprising: a semiconductor memory device; and a controller, the semiconductor memory device comprising: a plurality of blocks, each of the blocks comprising a plurality of pages, each of the pages having a plurality of memory cells; and a mark storage area provided at each of the blocks, the mark storage area of a block having defective bits less than N (N is an integer number more than 0) in all page in the blocks storing a first data showing a normal block, the mark storage area of a block including at least one page having defective bits more than N and including no page having defective bits more than M (M is an integer number M>N) storing a second data showing a pseudo-pass block as a pseudo-normal block, and the mark storage area of a block including at least one page having defective bits more than M storing a third data as a defective block, the controller, which uses a block stored with the first data in the mark storage area as a normal block, and does not use a block stored with the third data as a defective block, and further, make a test every error correction unit of each page with respect to a block stored with the second data, and furthermore, does not use a block as a defective block when the number of defective bits detected every error correction unit is larger than the number of error correctable defective bits while uses a block as an available block when the number of defective bits in all error correction units is less than the number of error correctable defective bits.

According to a third aspect of the invention, there is provided a semiconductor memory system comprising: a semiconductor memory device; and a controller, the semiconductor memory device comprising: a plurality of blocks, each of the blocks comprising a plurality of pages, each of the pages having a plurality of memory cells; and a mark storage area provided at each of the blocks, the mark storage area of a block having defective bits less than N (N is an integer number more than 0) in all page in the blocks storing a first data showing a normal block, the mark storage area of a block including at least one page having defective bits more than N and including no page having defective bits more than M (M is an integer number M>N) storing a second data showing a pseudo-pass block as a pseudo-normal block, and the mark storage area of a block including at least one page having defective bits more than M storing a third data as a defective block, the controller, which uses a block stored with the first data in the mark storage area as a normal block, and does not use a block stored with the third data as a defective block, and further, make a test every error correction unit of each page with respect to a block stored with the second data, and furthermore, does not use a block as a defective block when the number of defective bits detected every error correction unit is larger than (the number of error correctable defective bits)−α(α is the number of allowable defective bits generated later) while uses a block as an available block when the number of defective bits in all error correction units is less than (the number of error correctable defective bits)−α.

BRIEF DESCRIPTION OF THE SEVERAL VIEWS OF THE DRAWING

FIG. 1 is a flowchart to explain a screening test according to an embodiment of the present invention;

FIG. 11 is a flowchart to explain an operation of a controller according to a third modification example.

DETAILED DESCRIPTION OF THE INVENTION

Various embodiments of the present invention will be hereinafter described with reference to the accompanying drawings.

The following embodiment will be described giving a NAND flash memory as an example. However, the present invention is not limited to the NAND flash memory, and this embodiment is applicable to other non-volatile memories.

Figure 2:
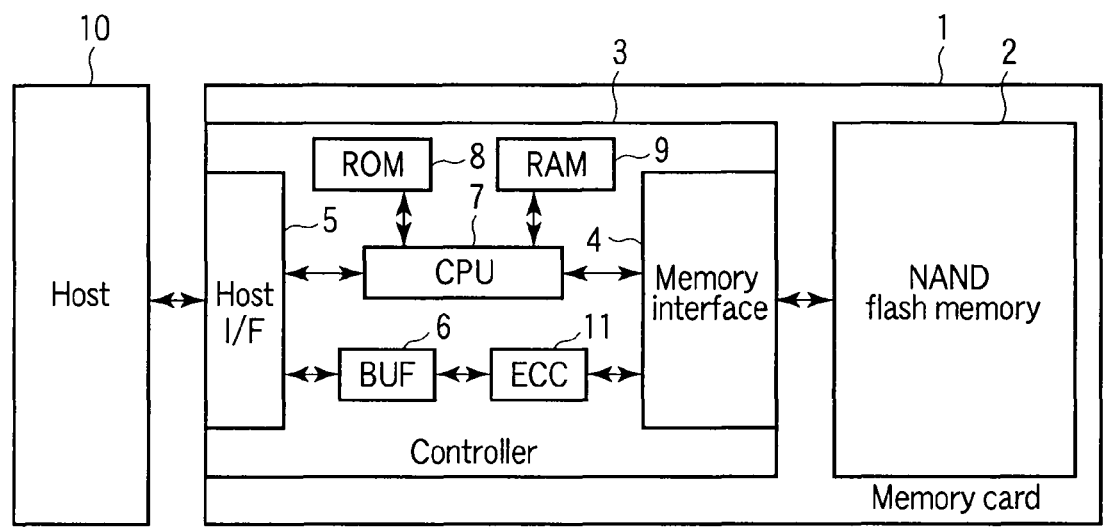
FIG. 2 is a block diagram showing the configuration of a memory card to which this embodiment is applied.

FIG. 2 shows the configuration of a memory device to which this embodiment is applied, for example, a memory card. In FIG. 2, a host apparatus (hereinafter, referred to as host) 10 includes hardware and software (system) for accessing a connected memory card. The host 10 makes accesses such as data read, data write and data erase with respect to a memory card 1.

When being connected with the host 10, the memory card 1 is supplied with power, and then, operated to carry out various processings in accordance with access from the host 10. For example, according to accesses such as data read, data write and data erase, the memory card 1 executes processings such as mapping of physical and logical addresses, ECC error correction and access to a NAND flash memory.

The memory card 1 includes the NAND flash memory 2 and a controller 3.

The controller 3 includes a memory interface 4, a host interface 5, buffer 6, a CPU 7, a Read Only Memory (ROM) 8, a Random Access Memory (RAM) and an Error Check and Correction circuit (ECC circuit) 11.

The memory interface 4 executes interface processing between the controller 3 and the NAND flash memory 2. The host interface 5 executes interface processing between the controller 3 and the host 10.

The buffer 6 temporarily stores a predetermined amount of data (e.g., one page) when writing data sent from the host 10 to the NAND flash memory 2. Further, the buffer 6 temporarily stores a predetermined amount of data (e.g., one page) when sending data read from the host 10 to the NAND flash memory 2. The ECC circuit corrects an error of the data read from the NAND flash memory 2. For example, Reed Solomon code and Bose-Chaudhuri-Hocquenghem (BCH) code are applied as the error correction code; in this case, other codes may be applicable.

The CPU 7 controls the whole operation of the memory card 1. When the memory card 1 is supplied with power, the CPU 7 starts processing according to firmware (control program) stored in the ROM 8. Specifically, the CPU 7 creates various tables (management data) required for the processing on the RAM 9. Further, the CPU 7 makes an access to the corresponding area on the NAND flash memory 2 when receiving write command, read command and erase command from the host 10. Furthermore, the CPU 7 makes conversion from a logical address to a physical address to make an access to the NAND flash memory 2, and controls data transfer via the buffer 6.

The ROM 8 is a memory storing control programs used by the CPU 7. The RAM 9 is used as a work area for the CPU 7, and a non-volatile memory storing various tables.

In this case, the NAND flash memory 2 shown in FIG. 2 has, for example, 2 Gbytes(=16 Gbits) having 4K blocks. Specifically, the page size is 4 Kbytes/page, and a block has 124 pages=512 Kbytes. The ECC circuit 11 can correct four portions (bits) per 512 bytes.

According to this embodiment, the most efficient system for the redundancy of the NAND flash memory is realized via the following two steps.

The first step is a screening test of the NAND flash memory. The screening test is made when the NAND flash memory is manufactured.

The second step is a test, which is made in a state that the NAND flash memory 2 screened via the first step is assembled as a memory card including a controller as shown in FIG. 2. The test of the second step may be made in either of before or after product delivery. Further, the test of the second step may be executed as a part of a normal operation after being powered; for example, an initialization operation of a memory card system.

(First Step)

Figure 3:
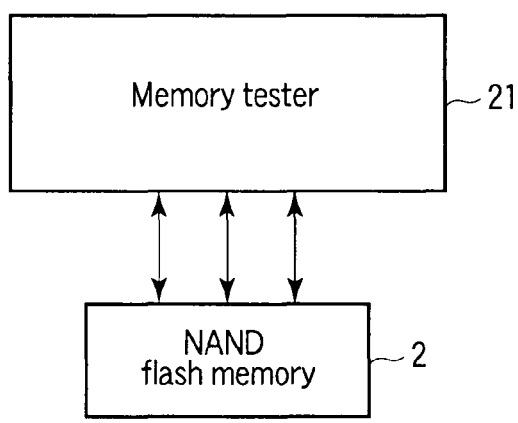
FIG. 3 is a block diagram schematically showing the configuration of a screening test.

FIG. 3 shows the configuration of the screening test made as the first step. The screening test is made using a memory tester 21. Specifically, the NAND flash memory 2 is connected with the memory tester 21 to make the following check. According to the check, test data is written to all pages forming blocks of the NAND flash memory 2 in which N-bit errors are allowable per page according to a pseudo-pass technique. Then, the written state is checked. According to the checked result, the block is classified into three categories, that is, a normal block (hereinafter, referred to as pass block), a defective block and a pseudo-pass B block. In this case, the pseudo-pass B block is a block, which is determined as having a possibility that the pseudo-pass B block is usable on the premise of correction by the ECC circuit compared with a block set as a defective block. The definition of each block category is as follows.

(1) A block having almost no defective in all page of the block (complete pass block), and block (pseudo-pass block) having N defective bits or less is defined as a pass block.

(2) A block including at least one page having N defective or more and having no page having M defective bits or more (M is an integer number of M>N) is defined as a pseudo-normal block, that is, pseudo-pass B block.

(3) A block including one page having M defective bits or more is defined as a defective block.

A mark is given to blocks classified to the categories in accordance with the category.

Figure 4:
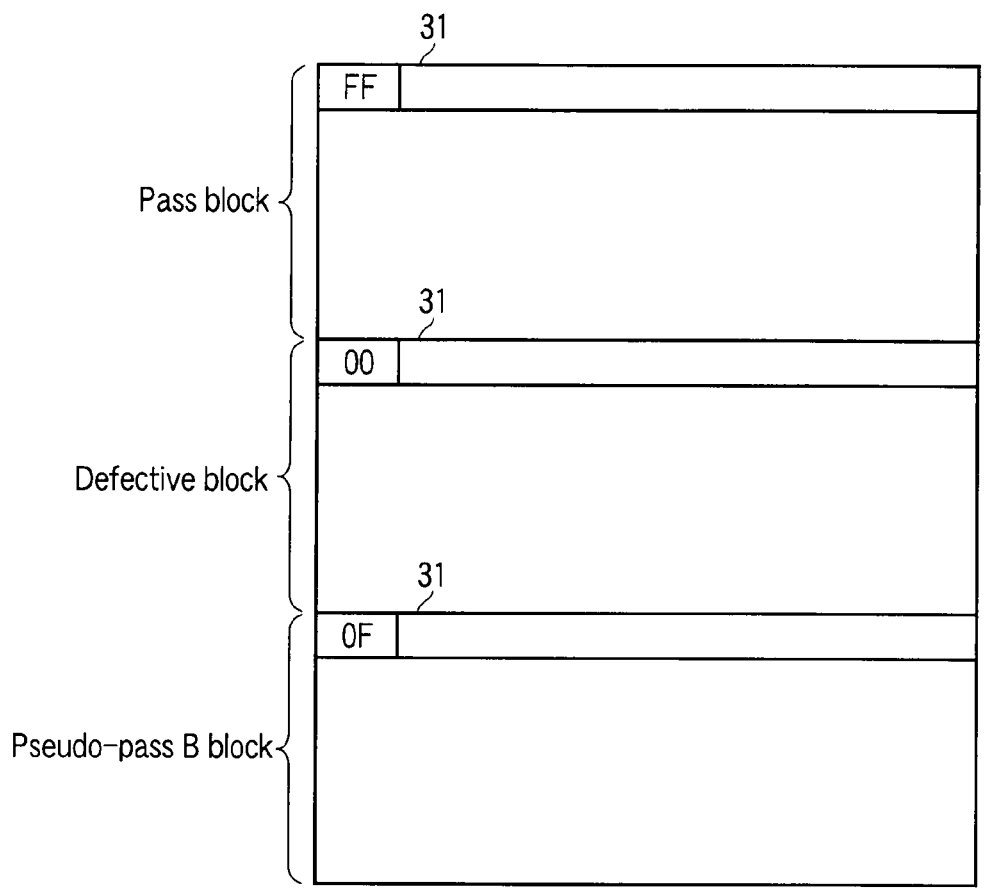
FIG. 4 is a view showing a marking example stored in each block.

FIG. 4 shows one example of the foregoing marking. For example, the header page of each block is provided with a defective mark storage area 31. For example, a defective mark storage area 31 of the pass block is stored with "FF" (hexadecimal). A defective mark storage area 31 of the defective block is stored with "00". A defective mark storage area 31 of the pseudo-pass B block is stored with "0F".

FIG. 1 shows an operation of the memory tester 21, and is a flowchart to explain the screening test. The screening test will be explained with reference to FIG. 1.

The screening test shown in FIG. 1 is applied to a NAND flash memory of 2 Gbytes(=16 Gbits) having 4K blocks. According to the 4K blocks, one page is 4 Kbytes, and a block has 124 pages=512 Kbytes. The ECC circuit can correct four portions per 512 bytes. The number of allowable defective bits is 2 as a pseudo-pass predetermined value. The numbers M and N of allowable defective bits are set to M=6 and N=3 as a pseudo-pass B predetermined value, respectively. The number $\alpha$ of allowable defective bits generated later is set as $\alpha=1$.

First, a block address B is initialized to "0" (S1). Thereafter, a page address P is initialized to "0", and then, data "FF" showing a pass block is written to the defective mark storage area 31 having block address "0" and page address "0" (S2). Then, a test of block address "0" and page address "0" is made (S3). According to the test, for example, test data is written to these block address "0" and page address "0" so that the written data is verified. The written data is verified, and thereby, it is determined whether or not the number of defective bits in page is more than six (6) portions (S4). As a result, if the number of defective bits in page is more than six portions, data "00" showing defective block is rewritten to the defective mark storage area 31.

Conversely, if the number of defective bits in page is less than six portions in step S4, it is determined whether or not the number of defective bits in page is more than four (4) portions (S6). As a result, if the number of defective bits is more than four portions, the data of the defective mark storage area 31 is rewritten to data "0F" showing pseudo-pass B block (S7). In addition, if the number of defective bits in page is less than three portions, the page is normal; therefore, the data of the defective mark storage area 31 is not rewritten as it is "FF" showing pass block. Thereafter, it is determined whether or not the page address P is the final page (S8). As a result, if the page address P is not the final page, the page address P is incremented (S9). The operation procedure proceeds to step S3, and then, a test of the next page is made in the same manner as above.

Conversely, if the page address P is the final page, the defective block is detected; for this reason, data "00" showing defective block is written to the defective mark storage area 31. In this case, it is determined whether or not the block is the final block (S10). As a result, if the block is not the final block, the block address B is incremented (S11), and then, the operation procedure proceeds to step S2. The same processing as above is carried out with respect to the next block.

By the operation, as shown FIG. 4, the defective mark storage 31 of each block is stored with a mark showing a block state.

Figure 5:
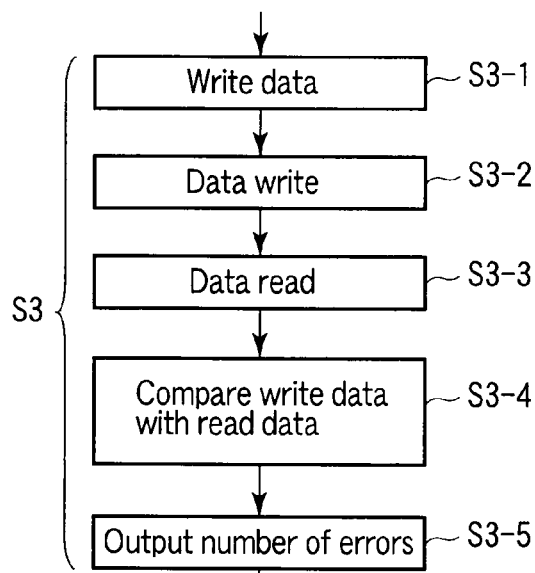
FIG. 5 is a flowchart to explain an embodied example of a part of FIG. 1.

FIG. 5 shows an embodied example of step S3 in FIG. 1. The modification example is applied to a NAND flash memory having a function of outputting the number of write errors.

In FIG. 5, when write data is received as test data, the write data is held in a latch circuit (S3-1). The held write data is written to a designated page of a designated block (S3-2). Thereafter, the written data is read (S3-3), and compared with the write data held in the latch circuit (S3-4). According to the compared result, read data different from the write data, that is, the number of error data is output (S3-5). Based on the outputted error data, the operation shown in FIG. 1 is carried out.

Figure 6:
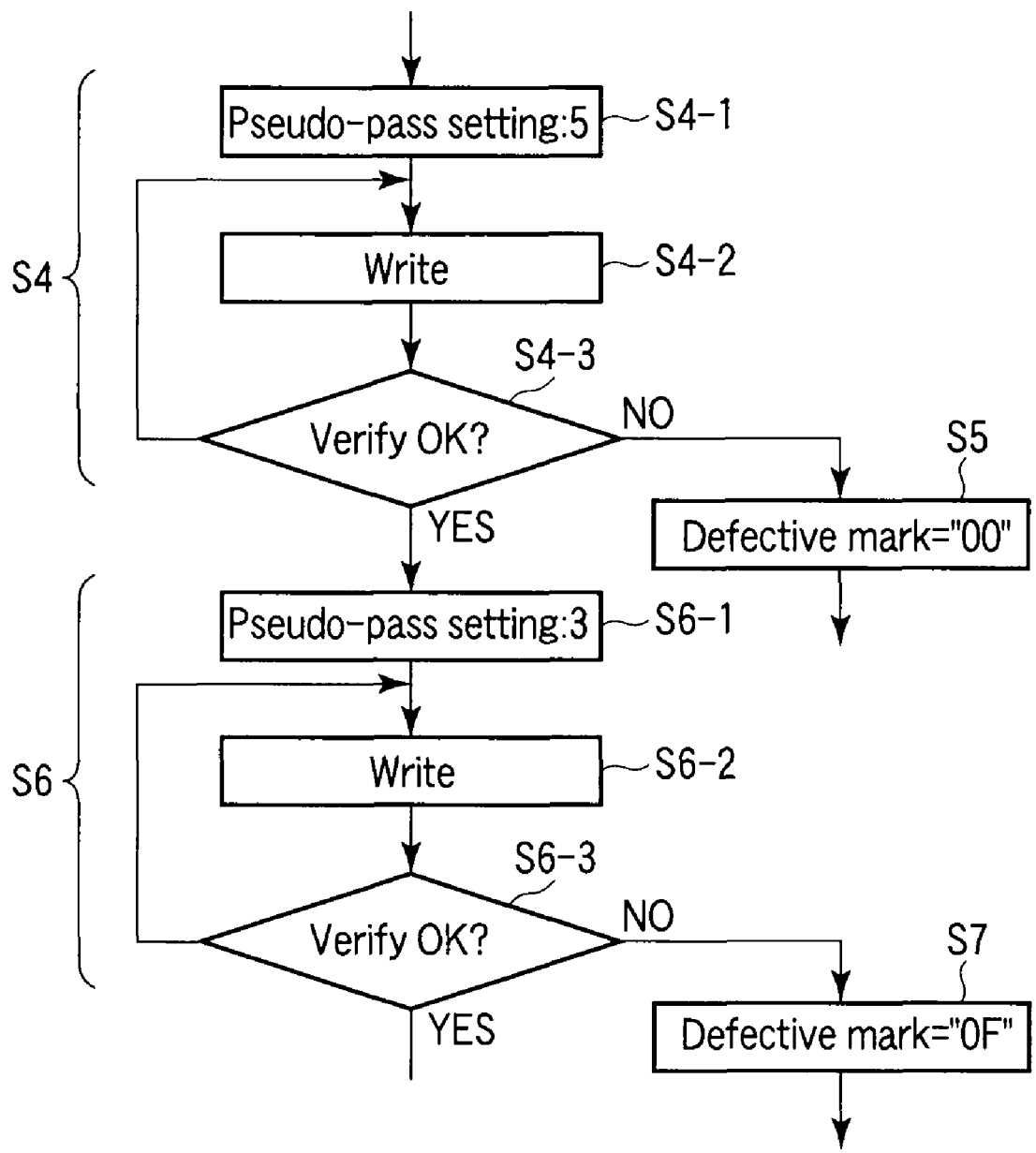
FIG. 6 is a flowchart to explain an embodied example of a part of FIG. 1.

FIG. 6 shows embodied examples of the foregoing steps S4 and S6. The NAND flash memory having the pseudo-pass function can output information whether or not all bit write are passed and the number of errors according to the verify read result. According to the example, data write and verify are carried out using the pseudo-pass function in a state that the number of allowable defective bits (called predetermined value) is preset. It is determined whether or not write ends within the preset number of allowable defective bits. In accordance with the determined result, it is determined whether the block is defective block, pseudo-pass B block or pass block.

In FIG. 6, the number of allowable defective bits certified as pseudo-pass B is set to 5, for example (S4-1). Thereafter, test data is written to a designated page of a designated block (S4-2). Verify is repeated predetermined times with respect to the written data (S4-3). The verify is carried out; as a result, if the number of defective bits exceeds the predetermined value of pseudo-pass B, a mark "00" showing defective block is written to the defective mark storage area 31 as a defective block (S5).

Conversely, the verify is carried out; as a result, if the number of defective bits is within the predetermined value of pseudo-pass B, the number of allowable defective bits certified as pseudo-pass B is set to 3, for example (S6-1). Thereafter, test data is written to a designated page of a designated block (S6-2). Verify is repeated predetermined times with respect to the written data (S6-3). The verify is carried out; as a result, if the number of defective bits exceeds the predetermined value of pseudo-pass B, a mark "0F" showing pseudo-pass block is written to the defective mark storage area 31 (S7). According to the verify result, if the number of errors is less than the predetermined value of pseudo-pass B, it is determined that the block is a pass block.

(Second Step)

According to the second step, a memory card system is assembled by combining the NAND flash memory to which the foregoing marking is given with a controller having a pseudo-pass function. The controller 3 shown in FIG. 2 searches all blocks of the NAND flash memory 2 to detect a mark of each block, and executes the following procedures. In the second step, the definition of the numbers of defective bits M and N is the same as the first step.

(1) A pass block is used as it is.
(2) A defective block is never used.
(3) In a pseudo-pass B block, the following processing is carried out with respect to each page.

Data write and data read are carried out with respect to each of Z(=8) ECC units included in each page. As a result, the number of defective bits detected every ECC unit is larger than (the number correctable by ECC circuit)−(the number of allowable defective bits generated later α). In this case, the block is recognized as a defective block, and is not used thereafter. If the number of defective bits detected from all ECC units is less than the umber correctable by the ECC circuit, the block is used thereafter as an available block.

As described above, a part of pages in the pseudo-pass B block includes the number of defective bits within a range correctable by the ECC circuit. For this reason, if the number of defective bits increases later, it is difficult to correct the defective bit by the ECC circuit. In such a case, the controller tests a state of the pseudo-pass B block to check the state, and thereby, the defective block redundancy is enabled.

Figure 7:
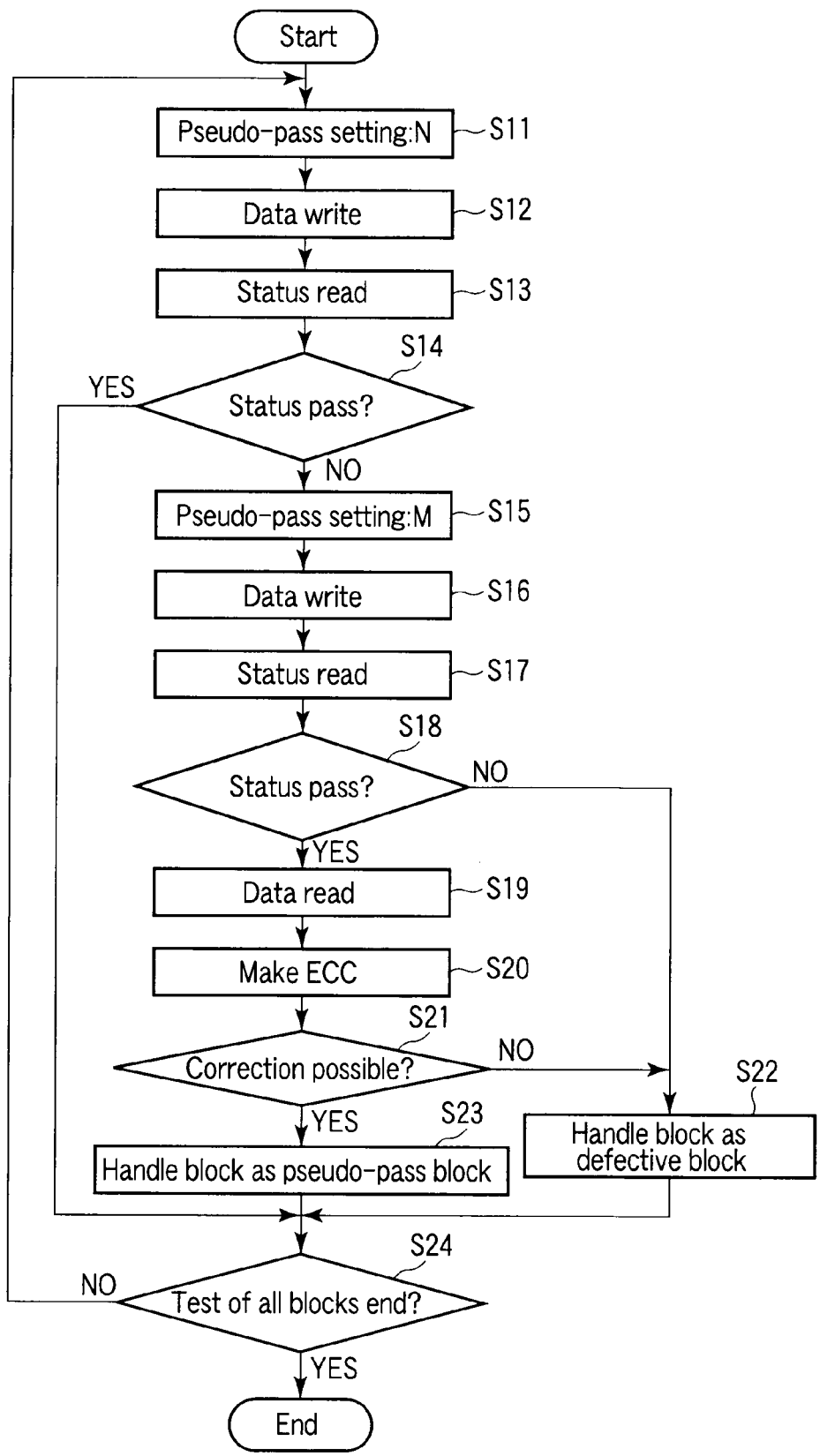
FIG. 7 is a flowchart to explain an operation of a controller.

FIG. 7 shows the operation of the controller 3.

In FIG. 7, the number of allowable defective bits of the pseudo-pass B block is set to N (S11). Test data is written to one page of a write target block of the NAND flash memory 2 using the pseudo-pass function (S12). Thereafter, status read is carried out with respect to the NAND flash memory 2 to read a status showing write pass/fail (S13). Then, the status is confirmed (S14). Specifically, if the read status shows "normal (pass)", the operation proceeds to the processing of the next block (S24). Conversely, the read status shows "failure (fail)", the number of allowable defective bits of the pseudo-pass B block is set to M(>N) (S15).

Specifically, a par of pages in the pseudo-pass B block includes defective bits more than N; therefore, the status of the block is determined as "fail". In addition, the block determined as "pass" has the number of defective bits more than N due to a later generation of defective bit. Even if the blocks are given, these blocks are usable as pseudo-pass B block so long as error corrections are possible. Thus, the number of allowable defective bits of the pseudo-pass B block is set to M, and thereafter, the test data is again written to the NAND flash memory 2 using the pseudo-pass function (S16). Then, status read is carried out with respect to the NAND flash memory 2 to read a status showing write pass/fail (S17) to confirm the status (S18).

Specifically, if the read status shows "fail", the write target block is hereinafter handled as a defective block (S22). Conversely, if the read status shows "pass", data is read from the NAND flash memory 2 (S19). Error correction of the read data is made using the ECC circuit 11 (S20) to confirm whether or not error corrections are possible (S21). As a result, if error correction is possible, the write target block is hereinafter handled as a pseudo-pass B block (S23). Conversely, if the error correction is impossible, the write target block is hereinafter handled as a defective block (S22). Thereafter, if the test of all blocks does not end, the same operation as above is carried out with respect to the next block (S24).

According to the embodiment, in the first step, the block of the NAND flash memory is classified into three categories, that is, pass block, defective block and pseudo-pass B block using the pseudo-pass function. The NAND flash memory having blocks classified into three categories via the first step is built in a memory card, for example. In this state, the pseudo-pass B block is checked in the second step. Namely, if the number of defective bits detected every ECC unit is larger than (the number correctable by ECC circuit)−(the number of allowable defective bits generated later α), the block is not used as a defective block. If the number of defective bits detected from all ECC units is less than the number correctable by the ECC circuit, the block is used as an available block. In this way, the block handled as defective block according to the conventional pseudo-pass technique is usable as a pseudo-pass B block. Therefore, the redundancy efficiency of defective blocks is improved; as a result, the yield is enhanced.

In addition, even if the number of defective bits increases later, the pseudo-pass B block is usable within an error correctable range. Therefore, it is possible to repair blocks, which have not been used as a defective block in the conventional case. This serves to improve the yield.

The effect of the foregoing embodiment will be described. In the following description, a NAND flash memory having 2 Gbytes(=16 Gbits) having 4K blocks is given as a premise. Specifically, a page is 4 Kbytes/page, and a block is 125 pages=512 Kbytes. In addition, according to the NAND flash memory, the number of allowable defective bits by pseudo-pass function is set as N=3, M=6, and the number of allowable defective bits generated later is set as α=1. An ECC circuit capable of correcting 4 bits per 512 B is given as a premise.

Figures 8, 9:
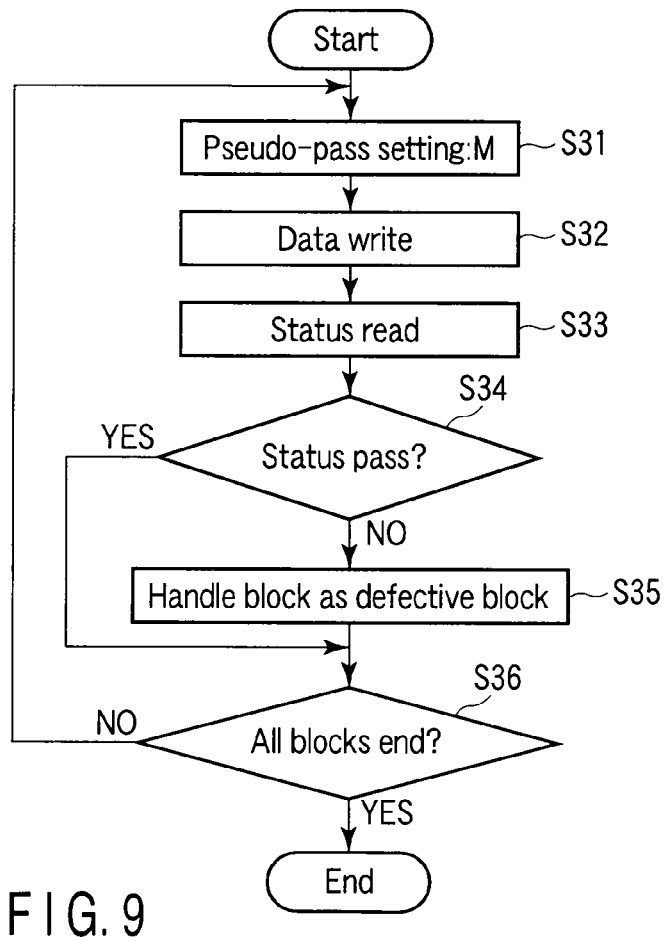
FIG. 8 is a table to explain the effect of this embodiment.
FIG. 9 is a flowchart to explain an operation of a controller according to a first modification example.

In this case, if a ratio (raw error ratio) including one bit per 512 byte is set to 1/10, the number of errors generated in one page (4 Kbytes), its generation ratio, the number of average generations and the number of accumulated generations are as shown in FIG. 8. The value used herein, that is, 1/10 is a usually used general value as an error ratio allowable using a proper ECC circuit on the premise that the same error ratio as the conventional NAND flash memory is given.

As shown in FIG. 8, the ratio of the page having no error is 43.0% (the probability having no error per 512 byte is 9/10). A probability (generation ratio) having no error in 4 Kbytes (512*8) is $(9/10)^8$=0.430. The generation ratio of the page having one error is 38.3% . . . . The number of pages having five errors is 214, and the number of pages having six errors is 12. The pages having errors more than six are very few so disregarded.

The number of pages having five errors or more is very few in all pages. That is, the generation ratio is 0.040%; therefore, the probability that a defective page having five errors or more exist more than two per block is small so disregarded. In other words, the block including one page having five errors or more is 226 (214+12), and the block including one page having six errors or more is 12 only.

The block including one page having five errors is 214. A probability such that all of five errors concentrate on one ECC unit (512 B) is obtained from the following equation.

$$_8C_1*(1/8)^5=1/4096$$

Therefore, the block such that all of five errors concentrate on one ECC unit is 0.052 at an average in 214 blocks.

A probability that four errors concentrate on one ECC unit (512 B) is obtained from the following equation, and is 0.037 at an average in 214 blocks.

$$_8C_1*(1/8)^4*_7C_1*(1/8)=7/4096$$

Therefore, the block such that four errors or more concentrate on one ECC unit is 0.042 at an average in 214 blocks.

According to the second step, the number of true defective blocks calculated by redundancy algorithm by the controller 3 is counted as the total of defective blocks of the following two kinds (1) and (2).

(1) A block having page (4 KB) including six errors or more. The block is 12 at an average.

(2) A block having page including five errors, and four or more of five errors concentrate on one ECC unit (512 B). The block is less than one (0.42) at an average.

The foregoing (2) means that in the blocks having page including five errors, 213 blocks are usable by redundancy because the number of errors concentrating on one ECC unit is three or less.

In this way, 213 of 226(=214+12) including page having five defective or more, which is not used as defect in the conventional case is usable as redundancy block by ECC. In other words, 94.2% of the blocks handled as defect so far are usable; therefore, this serves to largely improve the yield of the NAND flash memory.

If the controller 3 can not handle the pseudo-pass B block, the pseudo-pass B block is screened as being a defective block, and not used. For this reason, a NAND flash memory having the pseudo-pass B block may be applied to the controller 3, which can not handle the pseudo-pass B block.

FIG. 9 is a flowchart to explain the operation of the controller 3 according to a first modification example.

In FIG. 9, the number of allowable defective bits of a pseudo-pass B block is set to M (S31). Test data is written to the NAND flash memory using a pseudo-pass function (S32). Thereafter, status read is carried out with respect to the NAND flash memory (S33) to confirm the status (S34). As a result, if the read status shows "pass", the operation proceeds to processing for the next block (S36). Conversely, if the read status shows "fail", the write target block is handled as a defective block (S35). Thereafter, the operation proceeds to processing for the next block (S36).

According to the modification example shown in FIG. 9, the same effect as above is obtained.

Figure 10:
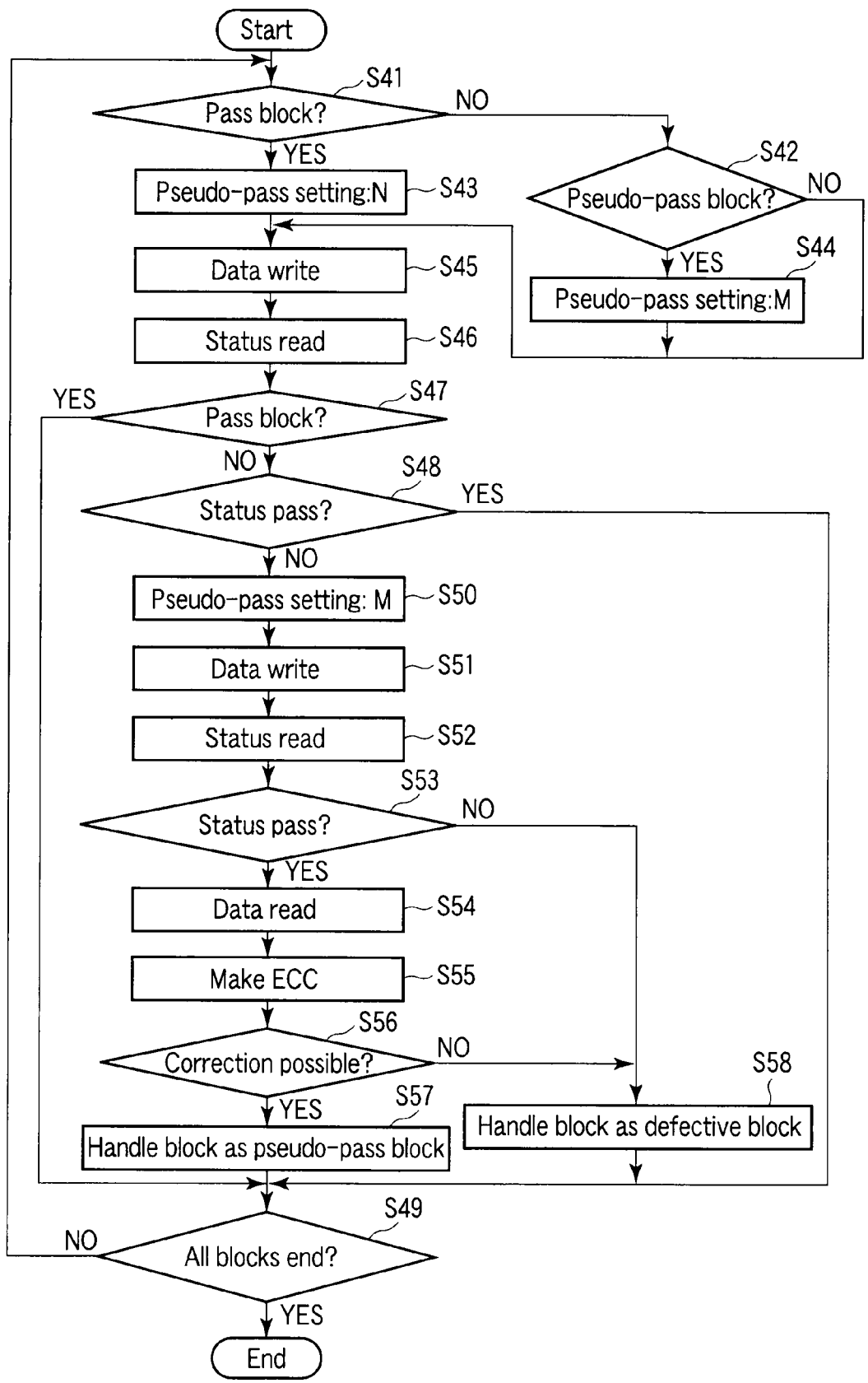
FIG. 10 is a flowchart to explain an operation of a controller according to a second modification example.

FIG. 10 is a flowchart to explain the operation of the controller 3 according to a second modification example.

In FIG. 10, it is determined whether a write target block is a pass block or pseudo-pass B block (S41, S42). As a result, if the write target block is a pass block, the number of allowable defective bits of a pseudo-pass function is set to N (S43). If the write target block is a pseudo-pass B block, the number of allowable defective bits of a pseudo-pass function is set to M (S44). Thereafter, data is written to one page of the write target block of the NAND flash memory 2 using the pseudo-pass function (S45). Then, status read is carried out with respect to the NAND flash memory (S46) to confirm the read status (S47, S48). As a result, if the write target block is a pass block and the read status shows "pass", the operation proceeds to processing for the next block (S49).

If the write target block is a pass block and the read status shows "fail", the number of allowable defective bits of a pseudo-pass function is set to M (S50). Thereafter, the same operation as the foregoing embodiment is carried out. Specifically, test data is again written to the NAND flash memory using a pseudo-pass function (S51). Then, status read is carried out with respect to the NAND flash memory 2 to read a status showing write pass/fail (S52). Thereafter, the status is confirmed (S53).

As a result, if the read status shows "fail", the write target block is hereinafter handled as a defective block (S58). Conversely, if the read status shows "pass", data is read from the NAND flash memory 2 (S54). Error correction by an ECC circuit 11 is made with respect to the read data (S55) to confirm whether or not error correction is possible (S56).

As a result, if error correction is possible, the write target block is hereinafter handled as a pseudo-pass B block (S57). Conversely, if error correction is impossible, the write target block is hereinafter handled as a defective block (S58). Thereafter, if test of all blocks dose not end, the same operation as above is carried out with respect to the next block (S49).

According to the second modification example, test data is written in a state that the number of allowable defective bits of the pass block is set to N and the number of allowable defective bits of the pseudo-pass B block is set to M. If the write target block is a pass block and the read status shows "fail", the number of allowable defective bits of the pseudo-pass function is increased to M to again make data write and status check. If the status shows "pass", it is determined whether or not errors are correctable by error correction. Thus, even if an error increases later in the pass block, the block is usable as a pseudo-pass B block within an error correctable range. Therefore, this serves to prevent an increase of defective blocks; as a result, the yield of the NAND flash memory is improved.

FIG. 11 is a flowchart to explain the operation of the controller 3 according to a third modification example.

According to the third modification example, a NAND flash memory having a function of returning the number of defective bits to the controller 3 together with status is given as an example.

In FIG. 11, the controller 3 writes test data to a NAND flash memory 2 (S61). Thereafter, status read is carried out with respect to the NAND flash memory 2 (S62) to confirm the status (S63). Specifically, in accordance with the number of defective bits shown in the status, a write target block is classified into the foregoing three categories (S64). For example, a block having defective bits less than N in all pages of the block is handled as a pass block. A block including at least one page having defective bits more than N and including no page having defective bits more than M (M is an integer number of M>N) is handled as a defective block.

According to the third modification example, even if defective bits are generated later, a block is classified into the corresponding category in accordance with the number of defective bits. This serves to prevent a generation of defective blocks, and to prevent reduction of available block.

In the embodiment, according to the pseudo-pass technique, minor defective bits in page is disregarded on the premise that correction by the ECC circuit is made, and the page is pseudo-handled as a normal page. In the broad sense, according to the pseudo-pass technique, even if all bits in a page are not written, write is completed when the number of non-write bits is less than a predetermined number.

According to the embodiment, the NAND flash memory is applied to a memory card. The present invention is not limited to the foregoing embodiment; for example, the NAND flash memory is applicable to an electronic apparatus such as USB memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory, comprising:
    a plurality of blocks, each of the blocks comprising a plurality of pages, each of the pages having a plurality of memory cells; and
    a mark storage area provided at each of the blocks,
    wherein the mark storage area of a block having defective bits fewer than N (N is an integer number more than 0) in all pages in the block stores a first data showing a normal block,
    the mark storage area of a block including at least one page having defective bits more than N and including no page having defective bits more than M (M is an integer number M >N) stores a second data showing a pseudo-pass block as a pseudo-normal block,
    the mark storage area of a block including at least one page having defective bits more than M stores a third data as a defective block,
    a block in which the first data is stored in the mark storage area is used, as a normal block,
    a block in which the third data is stored in the mark storage area is not used, but is classified as a defective block, and
    a block in which the second data is stored in the mark storage area is not used, but is classified as a defective block, when a number of defective bits detected for every error correction unit of each page is larger than a number of error correctable defective bits, while the block in which the second data is stored is used as an available block when the number of defective bits in all error correction units is less than the number of error correctable defective bits.

2. The memory according to claim 1, wherein the mark storage area is provided at each header page of the blocks.

3. The memory according to claim 1, wherein the semiconductor memory is a NAND flash memory having a page size of 1 KB or more.

4. The memory according to claim 3, wherein the NAND flash memory outputs a number of write errors.

5. A semiconductor memory system, comprising:
    a semiconductor memory device; and
    a controller,
    the semiconductor memory device comprising
        a plurality of blocks, each of the blocks comprising a plurality of pages, each of the pages having a plurality of memory cells; and
        a mark storage area provided at each of the blocks,
    wherein the mark storage area of a block having defective bits fewer than N (N is an integer number more than 0) in all pages in the block stores a first data showing a normal block,
    the mark storage area of a block including at least one page having defective bits more than N and including no page having defective bits more than M (M is an integer number M >N) stores a second data showing a pseudo-pass block as a pseudo-normal block,
    the mark storage area of a block including at least one page having defective bits more than M stores a third data as a defective block, and
    the controller, is configured to (1) use a block storing the first data in the mark storage area as a normal block, (2) not use a block storing the third data, but classify the block as a defective block, (3) make a test for every error correction unit of each page with respect to a block storing the second data, (4) not use the block storing the second data, but classify the block as a defective block when a number of defective bits detected every error correction unit is larger than a number of error correctable defective bits, and (5) use the block storing the second data as an available block when the number of defective bits in all error correction units is less than the number of error correctable defective bits.

6. The system according to claim 5, wherein the mark storage area is provided at each header page of the blocks.

7. The system according to claim 5, wherein the semiconductor memory is a NAND flash memory having a page size of 1 Kbyte or more.

8. The system according to claim 7, wherein the NAND flash memory outputs a number of write errors.

9. The system according to claim 7, wherein the controller has an error correction function of 4 or more per 512 bytes, and N ≧3, M >4.

10. The system according to claim 9, wherein the controller does not use a block stored with the second data in the mark storage area when it can not handle a pseudo-pass block.

11. A semiconductor memory system comprising:
    a semiconductor memory device; and
    a controller, the semiconductor memory device comprising
a plurality of blocks, each of the blocks comprising a plurality of pages, each of the pages having a plurality of memory cells; and
a mark storage area provided at each of the blocks,
wherein the mark storage area of a block having defective bits fewer than N (N is an integer number more than 0) in all pages in the block stores a first data showing a normal block,
the mark storage area of a block including at least one page having defective bits more than N and including no page having defective bits more than M (M is an integer number M >N) stores a second data showing a pseudo-pass block as a pseudo-normal block,
the mark storage area of a block including at least one page having defective bits more than M stores a third data as a defective block, and
the controller, is configured to (1) use a block storing the first data in the mark storage area as a normal block, (2) not use a block storing the third data, but classify the block as a defective block, (3) make a test for every error correction unit of each page with respect to a block storing the second data, (4) not use the block storing the second data, but classify the block as a defective block when a number of defective bits detected every error correction unit is larger than (a number of error correctable defective bits) - α(α being a number of allowable defective bits generated later), and (5) use a block as an available block when the number of defective bits in all error correction units is less than (the number of error correctable defective bits) - α.

12. The system according to claim 11, wherein the mark storage area is provided at each header page of the blocks.

13. The system according to claim 11, wherein the semiconductor memory is a NAND flash memory having a page size of 1 Kbyte or more.

14. The system according to claim 13, wherein the NAND flash memory outputs a number of write errors.

15. The semiconductor memory according to claim 13, wherein the controller has an error correction function of 4 or more per 512 bytes, and N ≧3, M >4.

16. The semiconductor memory according to claim 9, wherein the controller does not use a block stored with the second data in the mark storage area when it can not handle a pseudo-pass block.

17. The semiconductor memory according to claim 9, wherein the controller writes test data to one of the blocks of the semiconductor memory device to read a status from the semiconductor memory device, determines the number of defective bits included in the status, uses a block having defective bits fewer than N in all pages of the block, uses a block including at least one page having defective bits more than N and including no page having defective bits more than M (M is an integer number of M >N) as a pseudo-pass B block, and does not use a block including one page having defective bits more than M, but classifies the block as a defective block.

* * * * *